(12) United States Patent
Chen et al.

(10) Patent No.: US 10,914,006 B2
(45) Date of Patent: Feb. 9, 2021

(54) NANOPARTICLE CONTINUOUS-COATING DEVICE AND METHOD BASED ON SPATIAL ATOMIC LAYER DEPOSITION

(71) Applicant: Huazhong University of Science and Technology, Wuhan (CN)

(72) Inventors: Rong Chen, Wuhan (CN); Weiming Ba, Wuhan (CN); Kai Qu, Wuhan (CN); Yun Li, Wuhan (CN); Kun Cao, Wuhan (CN); Wei Dan, Wuhan (CN)

(73) Assignee: Huazhong University of Science and Technology, Wuhan (CN)

( * ) Notice: Subject to any disclaimer, the term of this patent is extended or adjusted under 35 U.S.C. 154(b) by 86 days.

(21) Appl. No.: 15/978,615

(22) Filed: May 14, 2018

(65) Prior Publication Data

US 2018/0355482 A1    Dec. 13, 2018

(30) Foreign Application Priority Data

Jun. 7, 2017    (CN) .......................... 2017 1 04237645

(51) Int. Cl.
   *C23C 16/455*    (2006.01)
   *C23C 16/44*    (2006.01)

(52) U.S. Cl.
   CPC .... *C23C 16/45551* (2013.01); *C23C 16/4417* (2013.01)

(58) Field of Classification Search
   CPC .......... C23C 16/45551; C23C 16/4417; C23C 16/45525; C23C 16/54; B82Y 40/00

USPC ............................................. 427/248.1–255.7
   See application file for complete search history.

(56) References Cited

U.S. PATENT DOCUMENTS

| | | | |
|---|---|---|---|
| 8,945,676 B2 * | 2/2015 | Maula | B01J 2/006 427/213 |
| 2013/0058728 A1 * | 3/2013 | Xiong | C23C 14/24 406/14 |
| 2014/0242365 A1 * | 8/2014 | De Vries | C23C 16/0272 428/216 |

* cited by examiner

*Primary Examiner* — Michael P Wieczorek
*Assistant Examiner* — Michael G Miller
(74) *Attorney, Agent, or Firm* — Maier & Maier, PLLC

(57) ABSTRACT

A nanoparticle continuous-coating device based on spatial atomic layer deposition. A first-stage pipeline unit, a second-stage pipeline unit, a third-stage pipeline unit and a fourth-stage pipeline unit which are connected sequentially. The first-stage pipeline unit is used for providing a first precursor and enabling the first precursor to be adsorbed on surfaces of nanoparticles. The third-stage pipeline unit is used for providing a second precursor and enabling the second precursor to react with the first precursor on the surfaces of the nanoparticles, so that a monomolecular thin film layer is generated on the surfaces of the nanoparticles. The second-stage and fourth-stage pipeline units are used for cleaning the nanoparticles and discharging the redundant first precursor, the redundant second precursor or reaction by-products.

7 Claims, 2 Drawing Sheets

NANOPARTICLE CONTINUOUS-COATING DEVICE AND METHOD BASED ON SPATIAL ATOMIC LAYER DEPOSITION

FIELD

The invention belongs to the technical field of atomic layer deposition, and particularly relates to a nanoparticle continuous-coating device and method based on spatial atomic layer deposition.

BACKGROUND

Powder particles have a series of excellent chemical and physical properties at the microscopic level, but at the same time, they also show the disadvantages of easy agglomeration, easy oxidation, and unstable properties. The disadvantages can be effectively overcome by coating protective thin films on the surfaces of the particles, and the particles with the protective thin films can also be used as a new composite material with excellent properties.

At present, the coating methods of powder particles mainly include solid phase method, liquid phase method, gas phase method and so on. As a special chemical vapor deposition technology, the atomic layer deposition technology has excellent uniformity and controllability compared to other deposition techniques. In this technology, the self-limiting chemisorption reaction of the powder surface is utilized to form a very uniform layer of nanoscale-thickness thin film, the thickness of which is precisely controlled by controlling the number of cycles. The conventional atomic layer deposition method can be directly applied to the surface of the substrate and can achieve a good coating effect. However, when the conventional atomic layer deposition method is used for coating nanoparticles with a very large specific surface area, serious particle agglomeration occurs, which directly impairs the coating rate and uniformity of the particle surfaces and thus limits further use of nanoparticles in the industry.

The literature entitled "continuous production of nanostructured particles using spatial atomic layer deposition" (J. Ruud van Ommen, Dirkjan Kooijman, Mark de Niet, Mojgan Taebi) discloses a method and device for continuous-coating of powder surfaces based on spatial atomic layer deposition. This device is mainly composed of a pipeline with an inner diameter of 4 mm and a length of 27 m. A nitrogen flow is introduced to enable the nanoparticles to continuously move in the pipe, and the precursors are sequentially introduced into the pipeline at different positions so as to achieve coating of the particles. However, the method disclosed in this paper has the following defects or deficiencies:

(1) only single-layer coating of nanoparticles can be achieved, and the deposition efficiency is low;

(2) the size of the device is too long, the pipeline is difficult to be processed and the pipeline wall after the reaction is difficult to be cleaned; and (3) without considering the problem of precursor separation in the coating process, contamination may occur.

SUMMARY

In view of the above-described problems, the invention provides a nanoparticle continuous-coating device and method based on spatial atomic layer deposition, which aims to make nanoparticles continuously pass through multi-stage pipelines to complete multiple processes of the atomic layer deposition reaction, and bring precursors into full contact with the particles, so as to increase the coating rate and uniformity of the deposited thin film and improve the powder surface coating efficiency.

To achieve the above objective, according to an aspect of the invention, there is provided a nanoparticle continuous-coating device based on spatial atomic layer deposition, comprising a first-stage pipeline unit, a second-stage pipeline unit, a third-stage pipeline unit and a fourth-stage pipeline unit which are connected sequentially, wherein the first-stage pipeline unit is an adsorption unit for providing a first precursor and enabling the first precursor to be adsorbed on surfaces of nanoparticles;

the third-stage pipeline unit is a reaction unit for providing a second precursor and enabling the second precursor to react with the first precursor on the surfaces of the nanoparticles, so that a monomolecular thin film layer is generated on the surfaces of the nanoparticles;

the second-stage and fourth-stage pipeline units are cleaning units for cleaning the nanoparticles and discharging the redundant first precursor, the redundant second precursor or reaction by-products; and through cooperation of the first-stage, second-stage, third-stage and fourth-stage pipeline units, nanoparticle cleaning and surface atomic layer deposition can be achieved, in which the nanoparticles are allowed to continuously pass through the multi-stage pipelines to complete multiple processes of the atomic layer deposition reaction so that rapid and uniform coating of the nanoparticles is realized.

Further, the first-stage pipeline unit includes a driving gas source, a pipeline, a powder supplying device, the first precursor and a cleaning chamber, in which the driving gas source is disposed at an end of the pipeline to supply adequate driving gas for the first-stage pipeline unit, the powder supplying device and the first precursor are disposed on two sides of the pipeline at a certain interval, the powder supplying device is used for controlling the nanoparticles to enter the pipeline, the first precursor is used for supplying the precursor for the first-stage pipeline unit, and the cleaning chamber has one end connected to the pipeline and the other end connected to the second-stage pipeline unit.

Further, the third-stage pipeline unit includes a driving gas source, a pipeline, the second precursor and a cleaning chamber, in which the driving gas source is disposed at an end of the pipeline to supply adequate driving gas for the third-stage pipeline unit, the second precursor is disposed on the pipeline to supply the precursor for the third-stage pipeline unit, and the cleaning chamber has one end connected to the pipeline and the other end connected to the four-stage pipeline unit.

Further, the second-stage pipeline unit and the fourth-stage pipeline unit have the same structure, are used for cleaning the nanoparticles and isolating the first-stage pipeline unit and the third-stage pipeline unit to avoid cross-contamination of different precursors, and include a driving gas source, a pipeline, and a cleaning chamber, in which the driving gas source and the cleaning chamber are respectively disposed at two ends of the pipeline.

Preferably, the driving gas source is a nitrogen source.

Preferably, the pipeline is an elongated stainless steel pipe.

Preferably, a filter net is disposed around the cleaning chamber and has a mesh size of 2000 to 3000 mesh.

Preferably, the first-stage, second-stage, third-stage and fourth-stage pipeline units are connected through standard pipeline joints to ensure the tightness of the gas path.

Further, valves are respectively disposed between the driving gas source and the pipeline, between the powder supplying device and the pipeline, between the first precursor and the pipeline and between the second precursor and the pipeline, and the valves are connected to solenoid valves to control on-off of the pipeline.

Further, the powder supplying device includes a feed port, a screw feed device, a discharge port and a driving motor, in which the feed port has a conical structure that facilitates the entry of the powder into the screw feed device, the driving motor is connected to an end of the screw feed device and is used for driving the screw feed device to rotate, and the discharge port is disposed at the middle part of the screw feed device and is connected to the first-stage pipeline unit.

Further, the screw feed device comprises screw blades and a center shaft, in which the center shaft has an end connected to the output shaft of the driving motor for driving the center shaft to rotate, and the screw blades rotates with the center shaft to drive the nanoparticles to move.

Further, the screw directions of the screw blades at two sides of the discharge port are opposite to each other, which facilitates movement of the nanoparticles to the discharge port and reduces the powder loss.

A nanoparticle continuous-coating method based on spatial atomic layer deposition, wherein the method is implemented by applying the device.

According to an aspect of the invention, there is provided a nanoparticle continuous-coating method based on spatial atomic layer deposition which is implemented by applying the device.

Further, the nanoparticle continuous-coating method based on spatial atomic layer deposition comprises:

(1) loading nanoparticles in a powder supplying device of a first-stage pipeline unit, and opening valves and a nitrogen source of the first-stage pipeline unit, so that the residual air in the pipeline is discharged, the nanoparticles continuously enter a pipeline under the action of the airflow and are fully mixed with the fluidized gas, the dispersed nanoparticles are saturatedly adsorbed by a first precursor in the nitrogen and then enter a cleaning chamber, the residual first precursor and reaction by-products are discharged, and the cleaned nanoparticles enter a second-stage pipeline unit from the end of the cleaning chamber of the first-stage pipeline unit;

(2) opening valves and a nitrogen source of the second-stage pipeline unit so that the nanoparticles passing through the first-stage pipeline unit continuously enter the pipeline under the action of the airflow, and controlling the flow rate of the nitrogen so that the nanoparticles are fully mixed with the nitrogen to complete cleaning of the nanoparticles;

(3) opening valves and a nitrogen source of a third-stage pipeline unit so that the nanoparticles passing through the second-stage pipeline unit continuously enter the pipeline under the action of the airflow, the dispersed nanoparticles in the pipeline are mixed with a second precursor to enable coating reaction between the first precursor on the surfaces of the nanoparticles and the second precursor, and the coated thin film enters the cleaning chamber under the action of the airflow to complete the initial removal of the residual precursor and the reaction byproducts; and (4) opening valves and a nitrogen source of a fourth-stage pipeline unit so that the nanoparticles passing through the third-stage pipeline unit continuously enter the pipeline under the action of the airflow, and controlling the flow rate of the nitrogen so that the nanoparticles are fully mixed with the nitrogen to achieve cleaning of the coated nanoparticles, and then the nanoparticles enter a collector to complete collection.

Further, the first precursor is trimethylaluminium.

Further, the second precursor is $H_2O$ or $O_3$.

Further, the nitrogen source has a flow rate of 500 sccm to 5000 sccm.

Further, the nitrogen source has a flow rate of 2000 sccm.

In general, compared with the prior art, the invention has the following advantageous effects:

(1) In the nanoparticle continuous-coating device and method based on spatial atomic layer deposition according to the invention, the nanoparticles are allowed to continuously pass through the multi-stage pipelines to complete multiple processes of the atomic layer deposition reaction, and the precursors are brought into full contact with the particles, increasing the coating rate and uniformity of the deposited thin film and improving the powder surface coating efficiency.

(2) In the nanoparticle continuous-coating device and method based on spatial atomic layer deposition according to the invention, through the multi-stage pipeline structure, the processes of the complete atomic layer deposition reaction are completed in stages to achieve spatial isolation of the atomic layer deposition reaction, in which a layer of coating thin film is formed on the surfaces of the nanoparticles by allowing the nanoparticles to alternately pass through different precursor reaction region in sequence and a desired thin film thickness is obtained through the cyclic movement. Furthermore, the assembly structure is used to facilitate subsequent extension and disassembly as well as the adjustment of the experimental process and the post-experimental cleaning.

(3) In the nanoparticle continuous-coating method based on spatial atomic layer deposition according to the invention, parameters such as the flow rate of the fluidized gas, the supplying amount of the nanoparticles and the pumping rate of the cleaning chamber are simple and easy to adjust, which facilitates the process comparative test to obtain the optimal flow rate of the fluidized gas, supplying amount of the nanoparticles and pumping rate, thereby achieving the largest coating rate while ensuring the particle dispersion effect.

BRIEF DESCRIPTION OF THE DRAWINGS

In FIGS. 1 and 2, the same structural elements are denoted by the same reference numerals, in which:

1: nitrogen source, 2: powder supplying device, 3: first precursor source, 4: pipeline, 5: cleaning chamber, 6: second precursor source, 7: driving motor, 8: feed port, 9 screw blade, and 10: discharge port.

DETAILED DESCRIPTION

For clear understanding of the objectives, features and advantages of the invention, detailed description of the invention will be given below in conjunction with accompanying drawings and specific embodiments. It should be noted that the embodiments described herein are only meant to explain the invention, and not to limit the scope of the invention.

The basic principle of the invention is that multi-stage pipelines and gas flow control are utilized to allow nanoparticles to continuously move in the pipelines and then pass through cleaning regions or precursor reaction regions, so as to achieve uniform coating of the nanoparticles, in which a space isolation method is adopted to allow different processes of the atomic layer deposition not to affect each other so that rapid and uniform coating of the nanoparticles under atmospheric pressure is realized.

Figure 1:
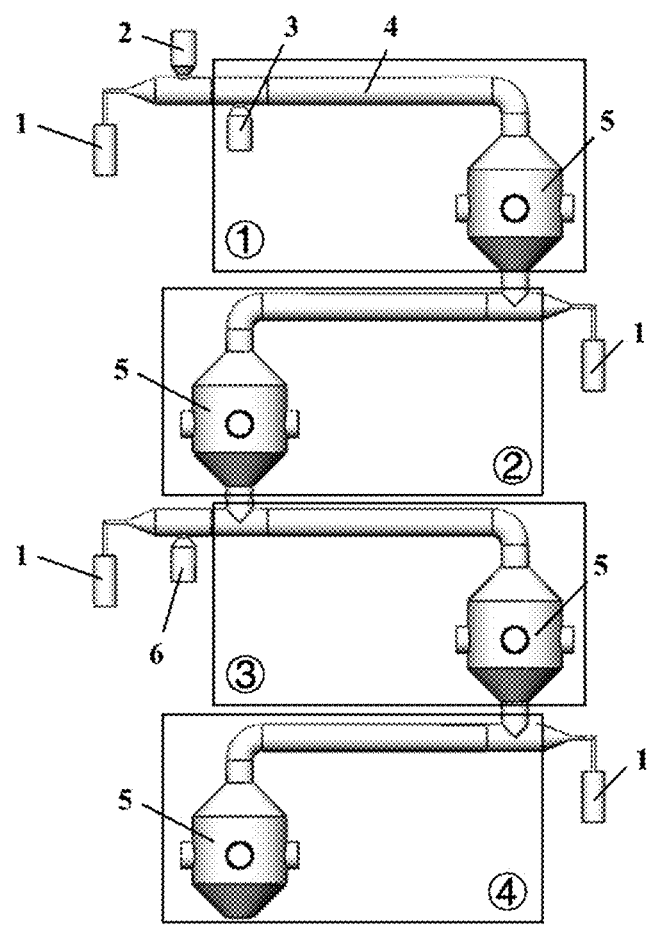
FIG. 1 is a schematic diagram of a nanoparticle continuous-coating device based on spatial atomic layer deposition according to an embodiment of the invention.

FIG. 1 is a schematic diagram of a nanoparticle continuous-coating device based on spatial atomic layer deposition according to an embodiment of the invention. As shown in FIG. 1, the nanoparticle continuous-coating device comprises a first-stage pipeline unit, a second-stage pipeline unit, a third-stage pipeline unit and a fourth-stage pipeline unit which are connected sequentially, wherein the first-stage pipeline unit is an adsorption unit for providing a first precursor and enabling the first precursor to be adsorbed on surfaces of the nanoparticles; the third-stage pipeline unit is a reaction unit for providing a second precursor and enabling the second precursor to react with the first precursor on the surfaces of the nanoparticles, so that a monomolecular thin film layer is generated on the surfaces of the nanoparticles; and the second-stage and fourth-stage pipeline units are cleaning units for cleaning the nanoparticles and discharging impurities such as redundant precursors or reaction by-products. Thus, through cooperation of the above four-stage pipeline units, nanoparticle cleaning and surface atomic layer deposition can be achieved, in which the nanoparticles are allowed to continuously pass through the multi-stage pipelines to complete multiple processes of the atomic layer deposition reaction, and the precursors are brought into full contact with the particles, thereby increasing the coating rate and uniformity of the deposited thin film and improving the powder surface coating efficiency.

As shown in FIG. 1, the first-stage pipeline unit specifically includes a driving gas source, a pipeline 4, a powder supplying device 2, a precursor source and a cleaning chamber 5.

In a preferred embodiment of the invention, the driving gas source is a nitrogen source 1.

As shown in FIG. 1, the third-stage pipeline unit specifically includes a driving gas source, a pipeline 4, a precursor source and a cleaning chamber 5.

In a preferred embodiment of the invention, the precursor source is divided into two: a first precursor source 3 and a second precursor source 6.

In a preferred embodiment of the invention, the pipeline for mixing the driving gas and the nanoparticles is an elongated stainless steel pipe.

As shown in FIG. 1, the nitrogen source 1 is provided at an end of the pipeline 4 to supply adequate nitrogen for the pipeline 4 in real, the powder supplying device 2 is provided on the pipeline 4 to control a certain amount of nanoparticles to continuously enter the pipeline 4, the first precursor source 3 is provided on the pipeline 4 and spaced from the powder supplying device 2 to supply a first precursor for the nanoparticles so as to achieve adsorption on the nanoparticles, and the cleaning chamber 5 has one end connected to the pipeline 4 and the other end connected to the second-stage pipeline unit.

In a preferred embodiment of the invention, a filter net is provided around the cleaning chamber 5, and its mesh size is preferably 3000 mesh.

During operation, by regulating the flow rate of the flow meter, the nitrogen is continuously fed into the pipeline 4 at a certain rate, and then the powder supplying device 2 controls a certain amount of nanoparticles to continuously enter the pipeline 4, so that the particles move along the pipeline together with the airflow and are fully dispersed. The first precursor source is controlled to enter the pipeline and be fully mixed with the nitrogen such that the first precursor 3 is coated on the surfaces of the nanoparticles and then reaches the cleaning chamber 5. The carrier gas, residual first precursor 3 and reaction by-products are discharged out of the pipeline under the action of pumpdown, while the powder particles are blocked by a 3000 mesh filter net around the chamber to be left in the cleaning chamber 5, and then enter the second-stage unit along with the airflow along the pipe for the next operation. The components are all connected through standard pipeline joints to ensure the tightness of the gas path, and meanwhile, valves are provided between the nitrogen source 1 and the pipeline 4, between the nanoparticles and the pipeline 4 and between the precursor sources and the pipeline 4, and the valves are connected to solenoid valves to control on-off of the pipeline.

As shown in FIG. 1, the structure of the second-stage pipeline unit and the fourth-stage pipeline unit is basically the same as that of the first-stage pipeline unit and the third-stage pipeline unit. The second-stage pipeline unit includes a nitrogen source 1, a pipeline 4 and a cleaning chamber 5. The fourth-stage pipeline unit includes a nitrogen source 1, a pipeline 4 and a cleaning chamber 5. The purpose of these two pipelines is to further clean the nanoparticles, and at the same time, to isolate the first-stage pipeline unit and the third-stage pipeline unit, thereby avoiding cross-contamination of different precursors. In the nanoparticle continuous-coating device based on spatial atomic layer deposition according to the invention, through the multi-stage pipeline structure, the processes of the complete atomic layer deposition reaction are completed in stages to achieve spatial isolation of the atomic layer deposition reaction, in which a layer of coating thin film is formed on the surfaces of the nanoparticles by allowing the nanoparticles to alternately pass through different precursor reaction region in sequence and a desired thin film thickness is obtained through the cyclic movement. Furthermore, the assembly structure is used to facilitate subsequent extension and disassembly as well as the adjustment of the experimental process and the post-experimental cleaning.

Figure 2:
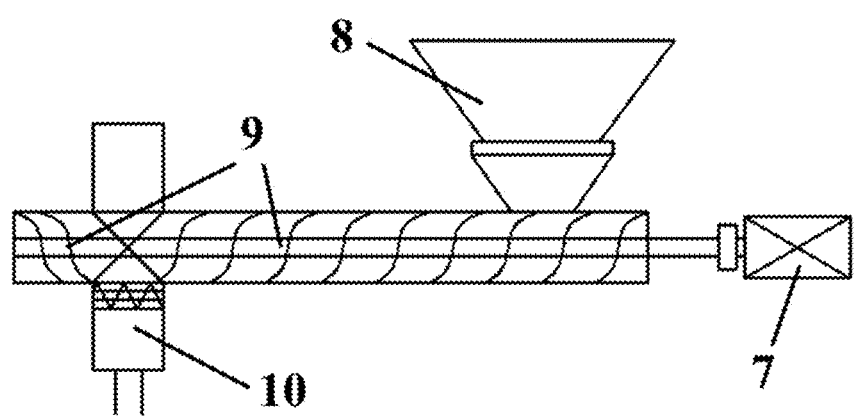
FIG. 2 is a schematic structural diagram of a powder supplying unit of the nanoparticle continuous-coating device based on spatial atomic layer deposition according to the embodiment of the invention.

FIG. 2 is a schematic structural diagram of a powder supplying unit of the nanoparticle continuous-coating device based on spatial atomic layer deposition according to the embodiment of the invention. As shown in FIG. 2, the powder supplying unit according to the invention includes a feed port 8, a screw feed device 9, a discharge port 10 and a driving motor 7. The feed port 8 has a conical structure that facilitates the entry of particles into the screw feed device 9. The main structure of the screw feed device 9 is a center shaft with screw blades, and the particles move under the driving of the screw blades. Further, a discharge port 10 is provided at the middle part of the screw feed device 9 and is connected to the first-stage pipeline unit. In a preferred embodiment of the invention, the screw directions of the screw blades at two ends of the discharge port 10 are opposite to each other, so that the nanoparticles can continue to move toward the discharge port 10, thereby reducing the powder loss.

Figure 3:
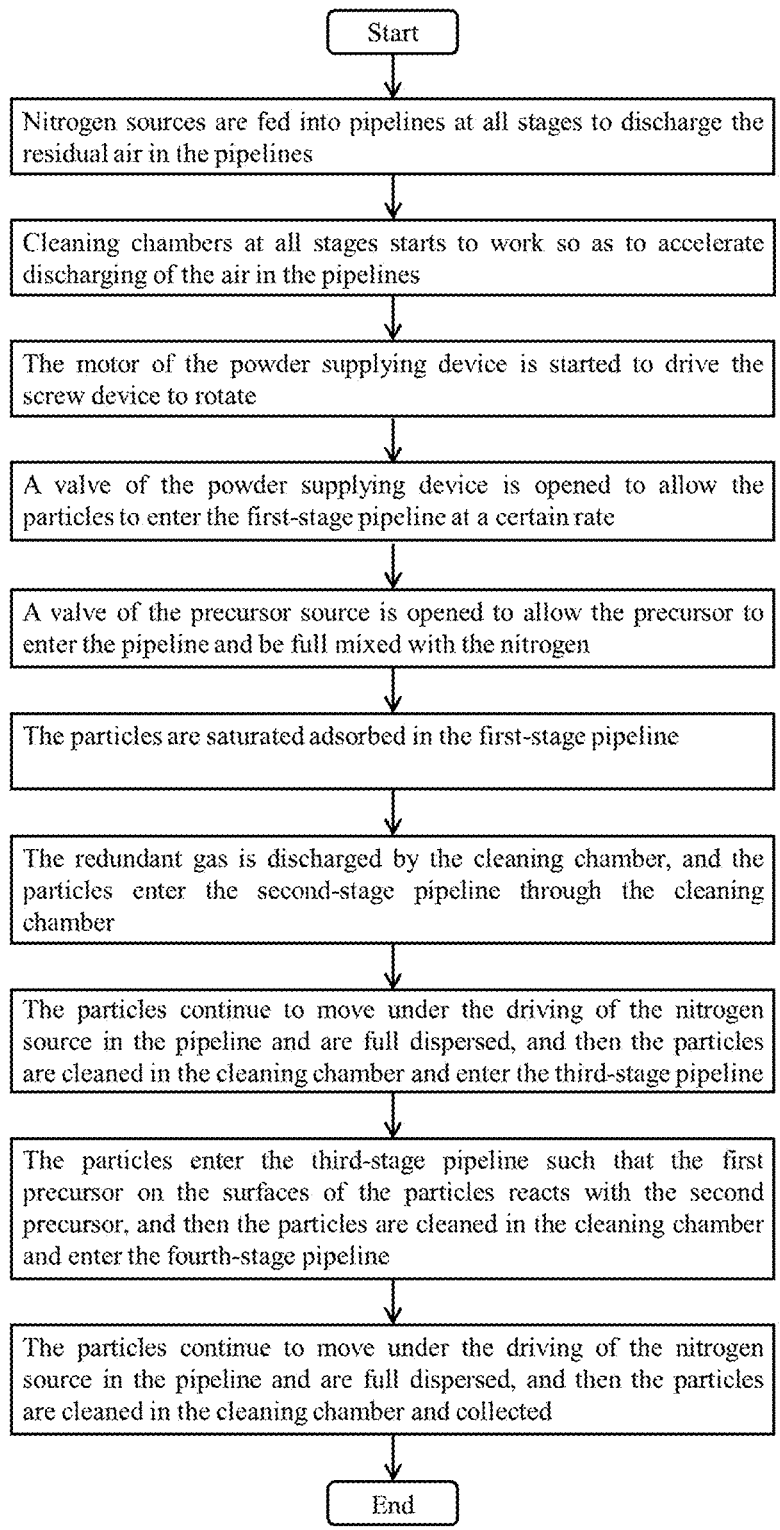
FIG. 3 is a flowchart of a nanoparticle continuous-coating method based on spatial atomic layer deposition according to the embodiment of the invention.

FIG. 3 is a flowchart of a nanoparticle continuous-coating method based on spatial atomic layer deposition according to the embodiment of the invention. As shown in FIG. 3, in a preferred embodiment of the invention, atomic layer deposition of nanoparticles is performed by using the nanoparticle continuous-coating device based on spatial atomic layer deposition, and the method specifically comprises:

(1) loading nanoparticles in a powder supplying device of a first-stage pipeline unit, and opening valves and a nitrogen source 1 of the first-stage pipeline unit, so that the residual air in the pipeline is discharged, the nanoparticles continuously enter the pipeline 4 under the action of the airflow and are fully mixed with the fluidized gas, the dispersed nanoparticles are saturated and adsorbed by a first precursor in the nitrogen and then enter a cleaning chamber 5, the residual first precursor and reaction by-products are discharged, and the cleaned nanoparticles enter a second-stage pipeline unit from the end of the cleaning chamber 5 of the first-stage pipeline unit;

(2) opening valves and a nitrogen source 1 of the second-stage pipeline unit so that the nanoparticles supplied from the first-stage pipeline unit continuously enter the pipeline 4 under the action of the airflow, and controlling the flow rate of the nitrogen so that the nanoparticles are fully mixed with the nitrogen to achieve further cleaning of the nanoparticles;

(3) opening valves and a nitrogen source 1 of a third-stage pipeline unit so that the nanoparticles supplied from the second-stage pipeline unit continuously enter the pipeline under the action of the airflow, the dispersed nanoparticles in the pipeline are mixed with a second precursor to enable coating reaction between the first precursor on the surfaces of the nanoparticles and the second precursor, and the coated thin film enters the cleaning chamber under the action of the airflow to complete the initial removal of the residual precursor and the reaction byproducts; and (4) opening valves and a nitrogen source of a fourth-stage pipeline unit so that the nanoparticles supplied from the third-stage pipeline unit continuously enter the pipeline under the action of the airflow, and controlling the flow rate of the nitrogen so that the nanoparticles are fully mixed with the nitrogen to achieve cleaning of the coated nanoparticles, and then the nanoparticles enter a collector to complete collection.

In a preferred embodiment of the invention, the nitrogen source 1 has a flow rate of 500 sccm to 5000 sccm, preferably 2000 sccm, at which the high-efficiency continuous coating can be achieved while ensuring the coating effect.

In a preferred embodiment of the invention, the first precursor is preferably trimethylaluminium, and the second precursor is preferably $H_2O$ or $O_3$.

In the nanoparticle continuous-coating method based on spatial atomic layer deposition according to the invention, parameters such as the flow rate of the fluidized gas, the supplying amount of the nanoparticles and the pumping rate of the cleaning chamber are simple and easy to adjust, which facilitates the process comparative test to obtain the optimal flow rate of the fluidized gas, supplying amount of the nanoparticles and pumping rate, thereby achieving the largest coating rate while ensuring the particle dispersion effect.

While particular embodiments of the invention have been shown and described, it will be obvious to those skilled in the art that changes and modifications may be made without departing from the spirit and scope of the invention.

What is claimed is:

1. A nanoparticle continuous-coating method based on spatial atomic layer deposition, comprising applying a coating to nanoparticles loaded into a nanoparticle continuous-coating device based on spatial atomic layer deposition, the device comprising a first-stage pipeline unit, a second-stage pipeline unit, a third-stage pipeline unit and a fourth-stage pipeline unit which are connected sequentially, wherein the first-stage pipeline unit is an adsorption unit for providing a first precursor and enabling the first precursor to be adsorbed on surfaces of nanoparticles;

the third-stage pipeline unit is a reaction unit for providing a second precursor and enabling the second precursor to react with the first precursor on surfaces of the nanoparticles, so that a monomolecular thin film layer is generated on the surfaces of the nanoparticles;

the second-stage and fourth-stage pipeline units are cleaning units for cleaning the nanoparticles and discharging redundant first precursor, redundant second precursor or reaction by-products; and through cooperation of the first-stage, second-stage, third-stage and fourth-stage pipeline units, nanoparticle cleaning and surface atomic layer deposition is achieved, in which the nanoparticles are allowed to continuously pass through multi-stage pipelines to complete multiple processes of the atomic layer deposition reaction so that rapid and uniform coating of the nanoparticles is realized;

wherein the first-stage pipeline unit comprises a first pipeline in communication with each of a first driving gas source, a nanoparticle powder supplying device, a first precursor source, and a first cleaning chamber disposed at a downstream end of the first pipeline, the first driving gas providing an airflow to drive the nanoparticles and first precursor through the first-stage pipeline unit;

the second-stage pipeline unit comprises a second pipeline in communication with each of a downstream end of the first cleaning chamber, a second driving gas source, and a second cleaning chamber disposed at a downstream end of the second pipeline, the second driving gas providing an airflow to drive the nanoparticles through the second-stage pipeline unit;

the third-stage pipeline unit comprises a third pipeline in communication with each of a downstream end of the second cleaning chamber, a third driving gas source, a second precursor source, and a third cleaning chamber disposed at a downstream end of the third pipeline, the third driving gas providing an airflow to drive the nanoparticles and second precursor through the third-stage pipeline unit; and the fourth-stage pipeline unit comprises a fourth pipeline in communication with each of a downstream end of the third cleaning chamber, a fourth driving gas source, and a fourth cleaning chamber disposed at a downstream end of the second pipeline, the fourth driving gas providing an airflow to drive the nanoparticles through the fourth-stage pipeline unit.

2. The nanoparticle continuous-coating method based on spatial atomic layer deposition of claim 1, comprising:

loading nanoparticles in the powder supplying device of the first-stage pipeline unit, and opening valves and the first driving gas source of the first-stage pipeline unit, so that residual air in the pipeline is discharged, the nanoparticles continuously enter the first pipeline under the action of airflow and are fully mixed with a fluidized gas, the dispersed nanoparticles are saturated and adsorbed by a first precursor in a driving gas and then enter the first cleaning chamber, residual first precursor and reaction by-products are discharged, and the cleaned nanoparticles enter the second-stage pipeline unit from the downstream end of the first cleaning chamber of the first-stage pipeline unit;

opening valves and the second driving gas source of the second-stage pipeline unit so that the nanoparticles passing through the first-stage pipeline unit continuously enter the second pipeline under the action of airflow, and controlling the flow rate of the driving gas so that the nanoparticles are fully mixed with the driving gas to complete cleaning of the nanoparticles;

opening valves and the third driving gas source of the third-stage pipeline unit so that the nanoparticles passing through the second-stage pipeline unit continuously enter the third pipeline under the action of airflow, the dispersed nanoparticles in the pipeline are mixed with a second precursor to enable a coating reaction between the first precursor on the surfaces of the nanoparticles and the second precursor, and a resulting coated thin film enters the third cleaning chamber under the action of airflow to complete the initial removal of the residual precursor and the reaction byproducts, and opening valves and the fourth driving gas source of the fourth-stage pipeline unit so that the nanoparticles passing through the third-stage pipeline unit continuously enter the fourth pipeline under the action of airflow, and controlling the flow rate of the driving gas so that the nanoparticles are fully mixed with the driving gas to achieve cleaning of the coated nanoparticles, and then the nanoparticles enter a collector to complete collection.

3. The nanoparticle continuous-coating method based on spatial atomic layer deposition of claim 2, wherein the first precursor is trimethylaluminium.

4. The nanoparticle continuous-coating method based on spatial atomic layer deposition of claim 2, wherein the second precursor is $H_2O$ or $O_3$.

5. The nanoparticle continuous-coating method based on spatial atomic layer deposition of claim 2, wherein one or more of the first driving gas source, the second driving gas source, the third driving gas source, and the fourth driving gas source has a flow rate of 500 sccm to 5000 sccm.

6. The nanoparticle continuous-coating method based on spatial atomic layer deposition of claim 2, wherein one or more of the first driving gas source, the second driving gas source, the third driving gas source, and the fourth driving gas source has a flow rate of 2000 sccm.

7. The nanoparticle continuous-coating method of claim 2, wherein one or more of the first driving gas, the second driving gas, the third driving gas, and the fourth driving gas is nitrogen.

* * * * *